(12) United States Patent
Jeong

(10) Patent No.: US 7,943,495 B2
(45) Date of Patent: May 17, 2011

(54) METHOD OF MANUFACTURING SEMICONDUCTOR DEVICE

(75) Inventor: Hee-Don Jeong, Hadong-gun (KR)

(73) Assignee: Dongbu HiTek Co., Ltd., Seoul (KR)

( * ) Notice: Subject to any disclaimer, the term of this patent is extended or adjusted under 35 U.S.C. 154(b) by 1 day.

(21) Appl. No.: 12/478,328

(22) Filed: Jun. 4, 2009

(65) Prior Publication Data

US 2009/0315100 A1  Dec. 24, 2009

(30) Foreign Application Priority Data

Jun. 20, 2008  (KR) .................. 10-2008-0058229

(51) Int. Cl.
*H01L 21/26* (2006.01)
*H01L 21/42* (2006.01)

(52) U.S. Cl. ........ 438/513; 438/680; 438/706; 438/745; 438/954; 257/E21.17; 257/E21.058; 257/E21.229; 257/E21.267; 257/E21.645; 257/E21.646

(58) Field of Classification Search .................. 438/954, 438/513, 680, 706, 745, 770, 238, 381; 257/E21.17, 257/58, 229, 267, 645, 646
See application file for complete search history.

(56) References Cited

U.S. PATENT DOCUMENTS

| 5,270,557 A | * | 12/1993 | Schmidt | 257/194 |
| 5,285,081 A | * | 2/1994 | Ando | 257/24 |
| 5,453,627 A | * | 9/1995 | Aihara et al. | 257/24 |

\* cited by examiner

*Primary Examiner* — David Nhu
(74) *Attorney, Agent, or Firm* — Sherr & Vaughn, PLLC

(57) ABSTRACT

Disclosed is a method of manufacturing a semiconductor device. The method includes forming an oxide-nitride-oxide (ONO) layer over a semiconductor substrate, and forming a recess over the semiconductor substrate by etching the ONO layer, forming a vertical structure pattern being higher than the ONO layer over the recess, sequentially forming a spacer oxide film and a first gate poly over the side wall of the vertical structure pattern, and forming a nitride film spacer at a partial region of the side wall of the first gate poly, removing the nitride film spacer, and forming a second gate poly in a spacer shape over the side wall of the first gate poly, and forming a first split gate and a second split gate, symmetrically divided from each other, by removing the vertical structure pattern.

16 Claims, 8 Drawing Sheets

METHOD OF MANUFACTURING SEMICONDUCTOR DEVICE

The present application claims priority under 35 U.S.C. 119 to Korean Patent Application No. 10-2008-0058229 (filed on Jun. 20, 2008), which is hereby incorporated by reference in its entirety.

BACKGROUND

Non-volatile semiconductor memory devices electrically erase and store data. They conserve data even if power is not supplied to the memory devices, and thus are increasingly applied to various industries including mobile communication systems and memory cards.

Among non-volatile memory devices, flash memory devices operate a program for each cell, and erase data for each block or sector. Since flash memory devices use a conductive material, such as doped polysilicon, as a floating gate material, parasitic capacitance between neighboring gate structures is increased with high integration. To solve this problem of flash semiconductor memory devices, a non-volatile semiconductor memory device called a metal-oxide-insulator-oxide-semiconductor (MOIOS) memory device, such as an silicon-oxide-nitride-oxide-semiconductor (SONOS) memory device or a metal-oxide-nitride-oxide-semiconductor (MONOS) memory device, has been developed. The SONOS memory device uses silicon as a control gate material, and the MONOS memory device uses metal as a control gate material.

MOIOS memory devices use a charge trap layer, such as a silicon nitride film, instead of a floating gate as a unit to store electric charges. That is, MOIOS memory devices replaces a stack (including a floating gate and insulating layers stacked over the upper and lower surfaces thereof), formed between a substrate and a control gate in a memory cell of a flash semiconductor memory device, with an oxide-nitride-oxide (ONO) stack including an oxide film, a nitride film, and an oxide film, sequentially stacked. MOIOS memory devices use a property that a threshold voltage is shifted by trapping electric charges in the nitride film.

MOIOS memory devices may be formed as a stack gate type, a split gate type, or a combination type thereof. In a split gate type SONOS memory devices, characteristics of a cell may be influenced by the length of the nitride film. Split gates may be formed by sequentially depositing an oxide film, a nitride film, and an oxide film over a substrate and etching the deposited oxide film, nitride film, and oxide film using a photoresist pattern. Here, an overlay variation in the photolithography to form the photoresist pattern may generate a difference in the lengths of the split gates.

Figure 1A:
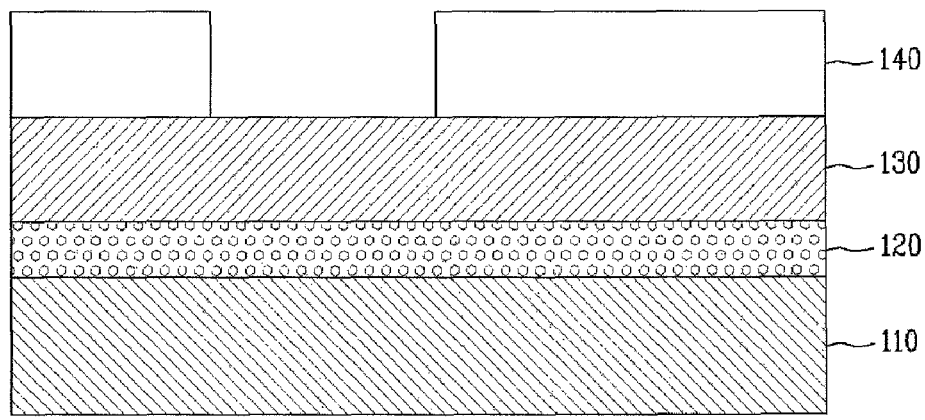
Figure 1B:
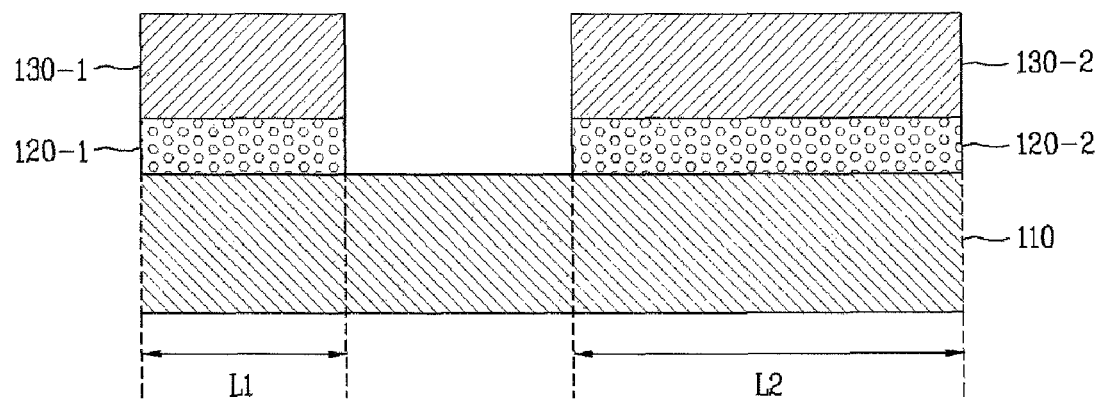

FIGS. 1A to 1B are longitudinal-sectional views illustrating a process of forming SONOS split gates. As shown in FIG. 1A, an ONO layer, i.e., a first oxide film 110, a nitride film 120, and a second oxide film 130 are sequentially formed over a substrate. Thereafter, a photoresist pattern 140 to form the split gates is formed by carrying out photolithography.

As shown in FIG. 1B, split second oxide films 130-1 and 130-2 and split nitride films 120-1 and 120-2 are formed by etching the second oxide film 130 and the nitride film 120 using the photoresist pattern 140 as a mask. Thereafter, the photoresist pattern 140 is removed.

In the formation of the photoresist pattern 140, as shown in FIG. 1a, misalignment of the photoresist pattern 140 may occur due to a minimal critical dimension of a photo and an overlay variation. When the second oxide film 130 and the nitride film 120 are patterned using the misaligned photoresist pattern 140, there may be a difference between the length L1 of the first split nitride film 120-1 and the length L2 of the second split nitride film 120-2 (for example, L2>L1).

When there is a difference between the length L1 of the first split nitride film 120-1 and the length L2 of the second split nitride film 120-2, the lengths of split charge trap nitride films of memory cells (for example, flash memory cells) are not uniform. Uniformity in the characteristics of the memory cells is reduced, and thus reliability of the semiconductor device may deteriorate.

SUMMARY

Embodiments relate to a method of manufacturing a semiconductor device, and more particularly, to a split gate type semiconductor memory device.

Embodiments relate to a method of manufacturing a semiconductor device, which prevents a variation in characteristics between memory cells according to an overlay variation in photolithography.

Embodiments relate to a method of manufacturing a semiconductor device which includes forming an oxide-nitride-oxide (ONO) layer over a semiconductor substrate, and forming a recess over the semiconductor substrate by etching the ONO layer, forming a vertical structure pattern being higher than the ONO layer over the recess, sequentially forming a spacer oxide film and a first gate poly over the side wall of the vertical structure pattern, and forming a nitride film spacer at a partial region of the side wall of the first gate poly, removing the nitride film spacer, and forming a second gate poly in a spacer shape over the side wall of the first gate poly, and forming a first split gate and a second split gate, symmetrically divided from each other, by removing the vertical structure pattern.

DRAWINGS

FIGS. 1A to 1B are longitudinal-sectional views illustrating a process of forming SONOS split gates.

Example FIGS. 2A to 2M are longitudinal-sectional views illustrating a method of manufacturing a semiconductor device in accordance with embodiments.

DESCRIPTION

Example FIGS. 2A to 2M are longitudinal-sectional views illustrating a method of manufacturing a semiconductor device in accordance with embodiments. First, as shown in example FIG. 2A, active regions 213 and device isolation regions 215 may be formed over a semiconductor substrate (for example, a p-type substrate) 210. The active regions 213 may be p-type wells or n-type wells.

For example, an epitaxial layer may be grown over the semiconductor substrate 210, and then slightly doped with a p-type impurity, i.e., boron. Thereafter, a mask to form the active regions 213 may be formed over the semiconductor substrate 210 using photolithography. N-type wells may be formed by implanting ions of an n-type impurity (for example, phosphorous) into the epitaxial layer at a high energy using the mask. Additional impurity ion implantation may be carried out to fix the threshold voltage of a cell, if necessary. Hereinafter, the semiconductor substrate 210 may include the epitaxial layer for convenience of illustration. Thereafter, the device isolation regions 215 may be formed through a recessed-local oxidation of silicon (R-LOCOS) process or a shallow trench isolation (STI) process. Alternatively, the device isolation regions 215 may be formed first on the semiconductor substrate 210, and then the wells (for example p-type wells) may be formed by carrying out selective ion implantation.

Figure 2A:
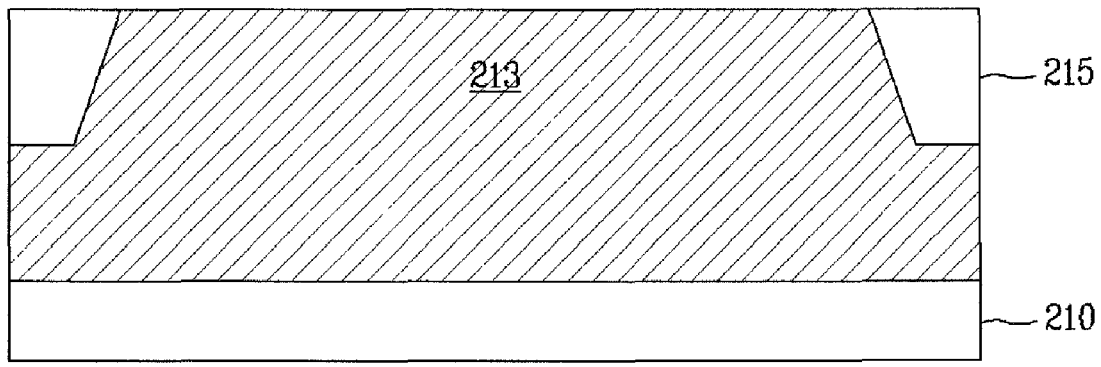
Figure 2B:
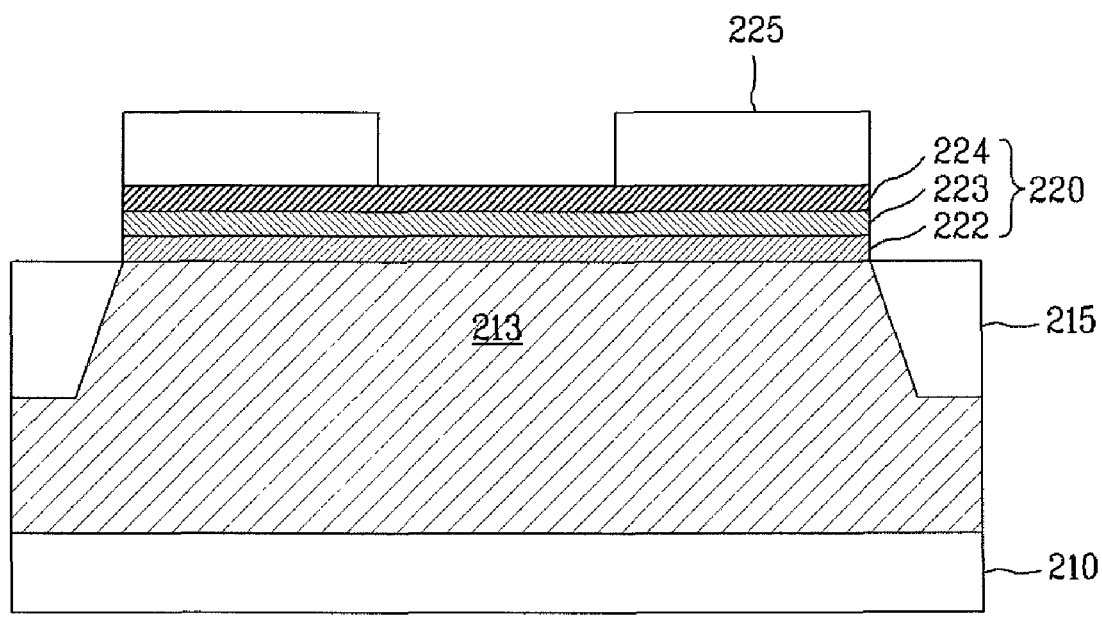

Thereafter, as shown in example FIG. 2B, an ONO layer 220 may be formed over the active region 213 of the semiconductor substrate 210. The ONO layer 220 may include a tunnel oxide film 222, a charge trap nitride film 223, and a buffer oxide film 224.

For example, the tunnel oxide film 222 may be formed by growing silicon oxide over the active region 213 to a thickness of 50~80 Å by thermal oxidation. Further, the tunnel oxide film 222 may be formed by depositing a high-k dielectric material, such as $Al_2O_3$, over the active region 213 by chemical vapor deposition (CVD) or atomic layer deposition (ALD).

Thereafter, the charge trap nitride film 223 may be formed by depositing a nitride film ($Si_xN_y$ (x and y are natural numbers)) over the tunnel oxide film 222 to a thickness of 70~100 Å by CVD. The buffer oxide film 224 may be formed by depositing a silicon oxide film over the charge trap nitride film 223 to a thickness of 50~80 Å by CVD. A photoresist pattern 225 may be formed over the ONO layer 220, for example, the buffer oxide film 224, by carrying out photolithography. The photoresist pattern 225 may expose a partial region of the buffer oxide film 224.

Figure 2C:
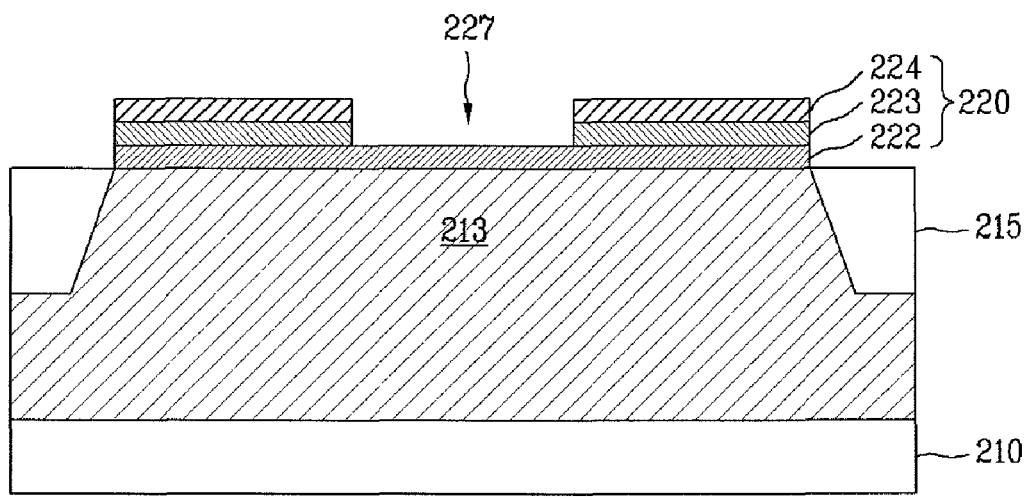

As shown in example FIG. 2C, the buffer oxide film 224 and the charge trap nitride film 223 may be etched using the photoresist pattern 225 as an etching mask, exposing a partial region 227 of the buffer oxide film 222. For example, the buffer oxide film 224 may be removed by dry-etching, and the charge trap nitride film 223 may be removed by dry-etching or wet-etching. The tunnel oxide film 222 serves as an etch stop layer. The photoresist pattern 225 may be removed through an ashing or stripping process.

Figure 2D:
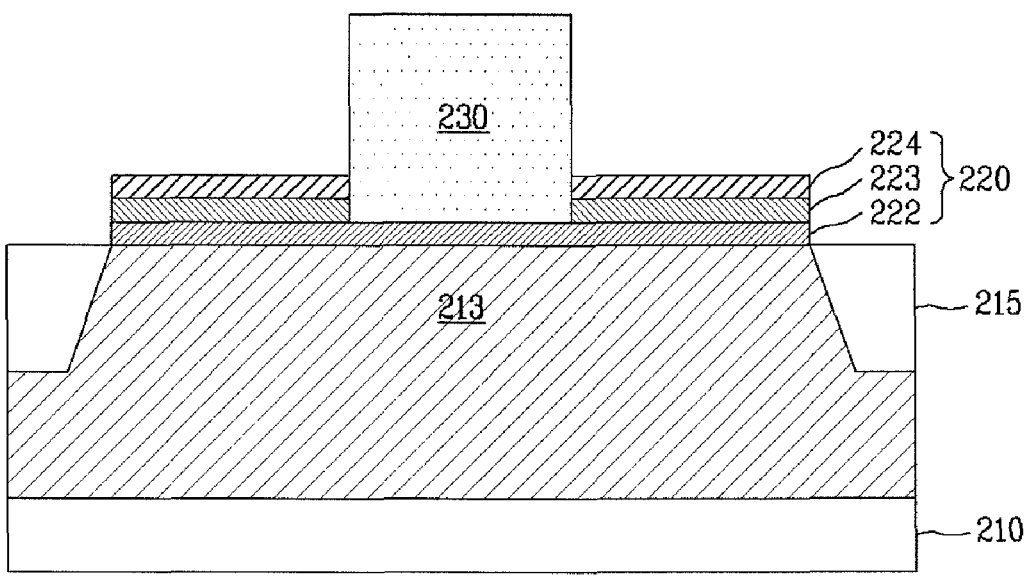

As shown in example FIG. 2D, a vertical structure 230 may be formed over the exposed region 227 of the tunnel oxide film 222. For example, a nitride film or silicon oxide film having a thickness of 3,000~4,000 Å may be deposited over the semiconductor substrate 210, in which the region 227 of the tunnel oxide film 222 is exposed. Then, the deposited nitride film or silicon oxide film may be patterned by photolithography and etching. The vertical structure 230 may be thereby formed over the region 227 of the tunnel oxide film 222. The vertical structure 230 has a larger thickness than the total thickness of the charge trap nitride film 223 and the buffer oxide film 224.

Figure 2E:
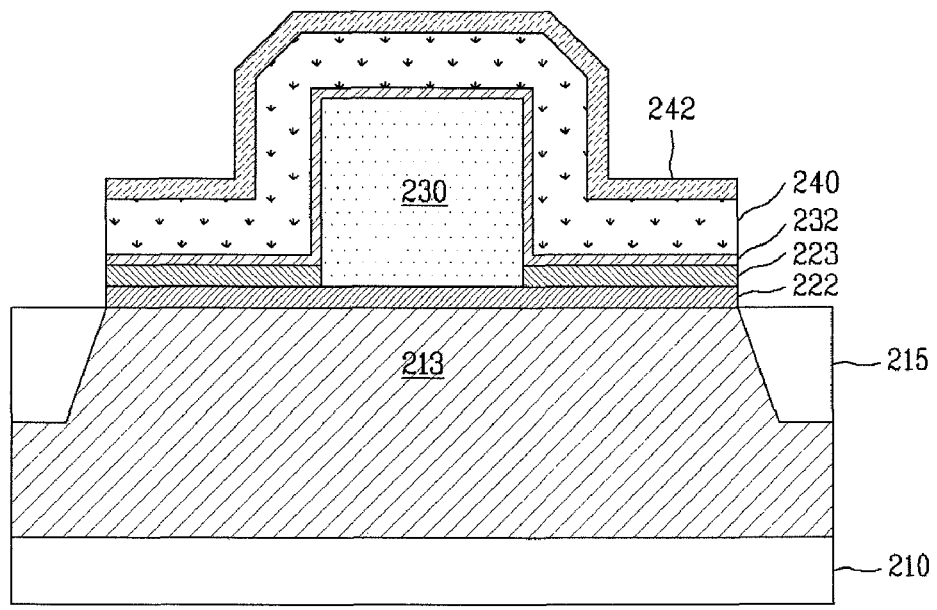

Thereafter, as shown in example FIG. 2E, the buffer oxide film 224 remaining over the charge trap nitride film 223 may be removed. A first oxide film 232 covering the upper surface of the charge trap nitride film 223, exposed by removing the buffer oxide film 224, and the side wall and upper surface of the vertical structure 230, may be formed.

For example, after the removal of the buffer oxide film 224, the first oxide film 232 may be formed by growing an oxide film to a designated thickness by thermal oxidation, and bringing the oxide film to a designated thickness by wet-etching to improve the film quality of the charge trap nitride film 223. The total thickness of the first oxide film 232 may be 60~90 Å.

A polysilicon layer 240 may be formed by depositing polysilicon over the first oxide film 232 to a thickness of 1,000~1,500 Å using CVD, and a first nitride film 242 is deposited over the polysilicon layer 240 to a thickness of 50~150 Å.

Figure 2F:
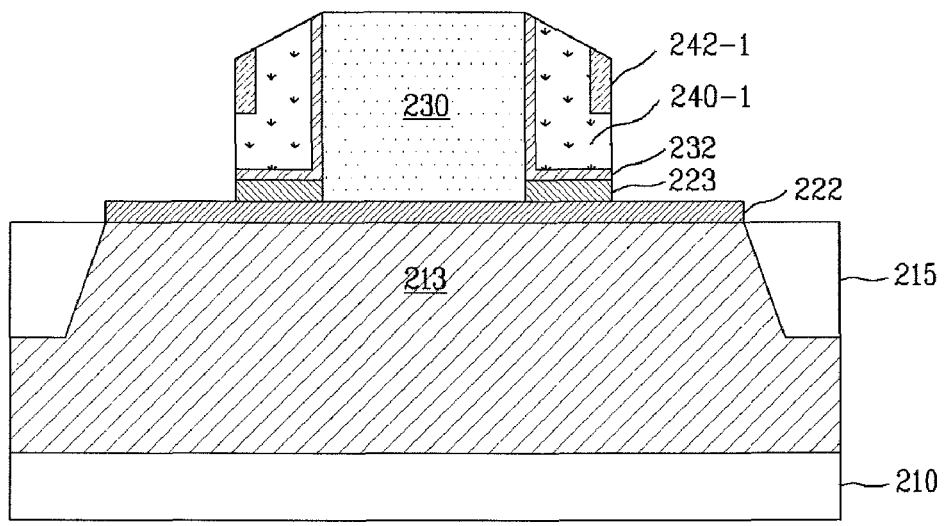

As shown in example FIG. 2F, an etch-back process of the first nitride film 242 and the polysilicon layer 240 may be carried out until the upper surface of the vertical structure 230 is exposed. Through the etch-back process, the first nitride film 242 and the polysilicon layer 240 located over the upper surface of the vertical structure 230 may be entirely removed, but the polysilicon layer 240 located over the side wall of the vertical structure 230 partially remains. Further, the first nitride film 242-1, which is not etched back, remains over a partial region of the side wall of the remaining polysilicon layer 240-1. For example, as shown in example FIG. 2F, the first nitride film 242-1, which is not etched back, may remain over the upper region of the side wall of the remaining polysilicon layer 240-1. Further, through the etch-back process, the polysilicon layer 240, the first oxide film 232, and the charge trap nitride film 233 may be partially etched back to partially expose the tunnel oxide film 222.

Therefore, the first oxide film 232 may be formed in a spacer shape over the side wall of the vertical structure 230 through the etch-back process. The polysilicon layer 240 forms a first gate poly 240-1 in a spacer shape over the side wall of the vertical structure 230, i.e., the spacer-shaped first oxide film 232. Further, the first nitride film (hereinafter, referred to as a "spacer nitride film") 242-1, which is not etched back during the etch-back process, remains over a partial region of the side wall of the first gate poly 240-1.

Figure 2G:
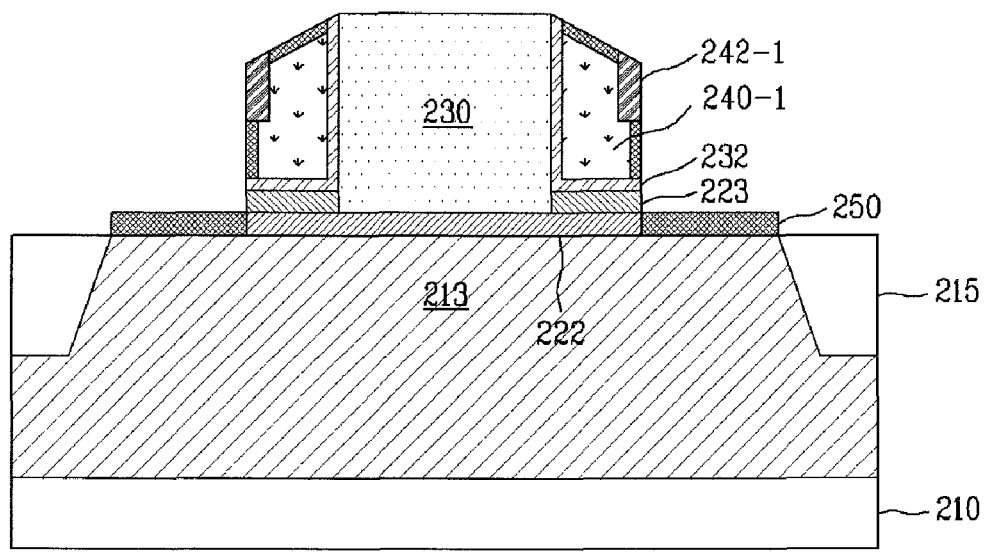

As shown in example FIG. 2G, the surface of the tunnel oxide film 222, which is exposed by the etch-back process, may not be uniform due to damage (for example, plasma damage) during the etch-back process, and thus the tunnel oxide film 222 is removed. A second oxide film 250 may be grown over the semiconductor substrate 210, which is exposed by removing the tunnel oxide film 222, by thermal oxidation. The second oxide film 250 may be formed simultaneously with the formation of a gate oxide film of a peripheral transistor.

In the thermal oxidation to form the second oxide film 250, the exposed surface of the first gate poly 240-1 made of polysilicon may be oxidized. However, the spacer nitride film 242-1 formed in the partial region of the side wall of the first gate poly 240-1 prevents oxidation of polysilicon, and thus the partial region of the side wall of the first gate poly 240-1 provided with the spacer nitride film 242-1 may not be oxidized.

Figure 2H:
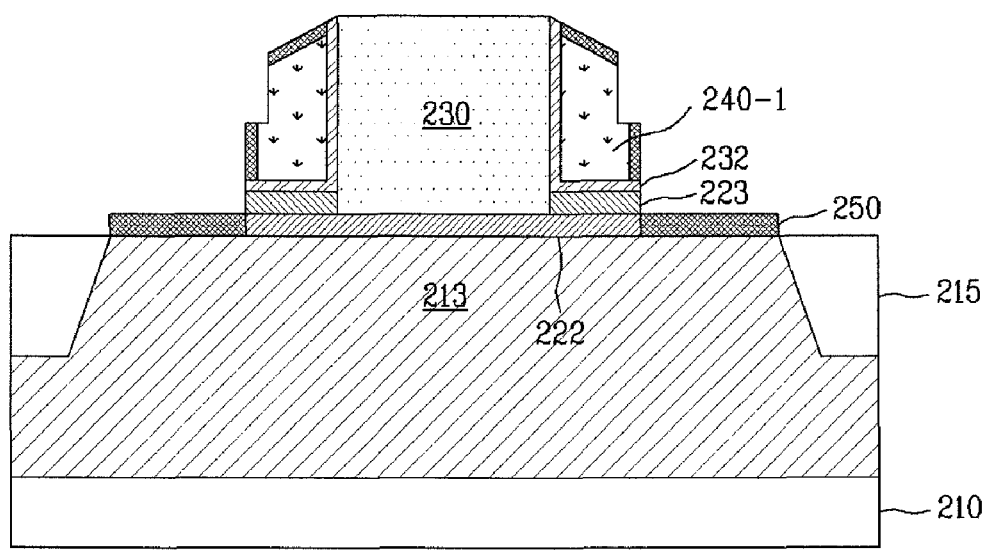

As shown in example FIG. 2H, the spacer nitride film 242-1 formed in the partial region of the side wall of the first gate poly 240-1 may be removed using wet-etching.

Figure 2I:
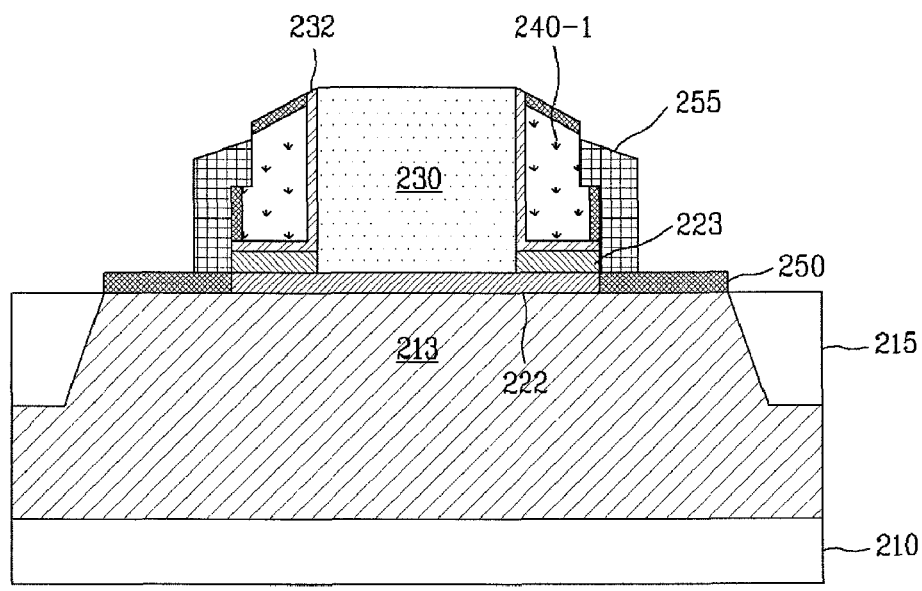

As shown in example FIG. 2I, a second gate poly 255 may be formed in a spacer shape over the side wall of the first gate poly 240-1, from which the spacer nitride film 242-1 is removed. For example, the second gate poly 255 may be formed by depositing polysilicon over the semiconductor substrate 210 provided with the first gate poly 240-1, from which the spacer nitride film 242-1 may be removed, to a thickness of 1,500~2,000 Å by CVD, and by carrying out an etch-back process upon the deposited polysilicon.

The second gate poly 255 may be formed in a spacer shape over the side wall of the first gate poly 240-1. The second gate poly 255 contacts the first gate poly 240-1 where the spacer nitride film 242-1 was removed. Thus, the first gate poly 240-1 and the second gate poly 255 are electrically connected. This is because the second oxide film 250 is not formed over the part of the first gate poly 240-1 from which the spacer nitride film 242-1 is removed.

Figure 2J:
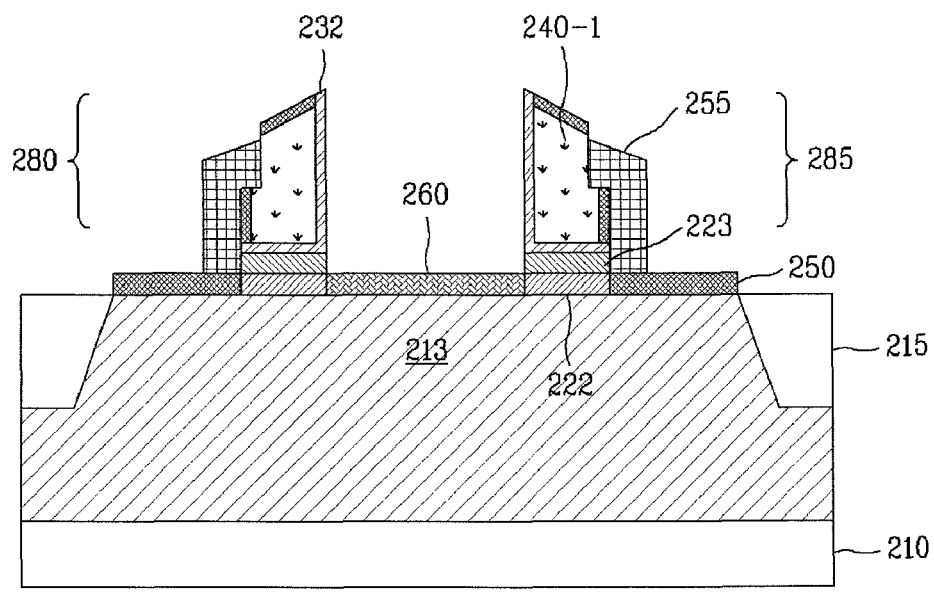

As shown in example FIG. 2J, the vertical structure 230 may be removed. The vertical structure 230 may be removed by dry-etching or wet-etching. For example, if the vertical structure 230 is made of nitride, the vertical structure 230 may be removed by wet-etching using phosphoric acid. After the vertical structure 230 is removed by etching, the tunnel oxide film 222 remaining under the vertical structure 230 may be removed. This may be done because the tunnel oxide film 222 remaining under the vertical structure 230 may be damaged during the etching of the vertical structure 230.

A first split gate 280 and a second split gate 285 may be formed over the semiconductor substrate 210 by removing the vertical structure 230. The first split gate 280 and the second split gate 285 are self-aligned and therefore symmetrically formed.

Since the first charge trap nitride film 223-1 of the first split gate 280 and the second charge trap nitride film 223-2 of the second split gate 285 have the same length, a memory device (for example, a flash memory) with no difference in characteristics between a memory cell including the first split gate 280 and a memory cell including the second split gate 285 may be manufactured. Thereafter, a third oxide film 260 may be formed over the semiconductor substrate 210, which is exposed by removing the tunnel oxide film 222 remaining under the vertical structure 230, using thermal oxidation.

Figure 2K:
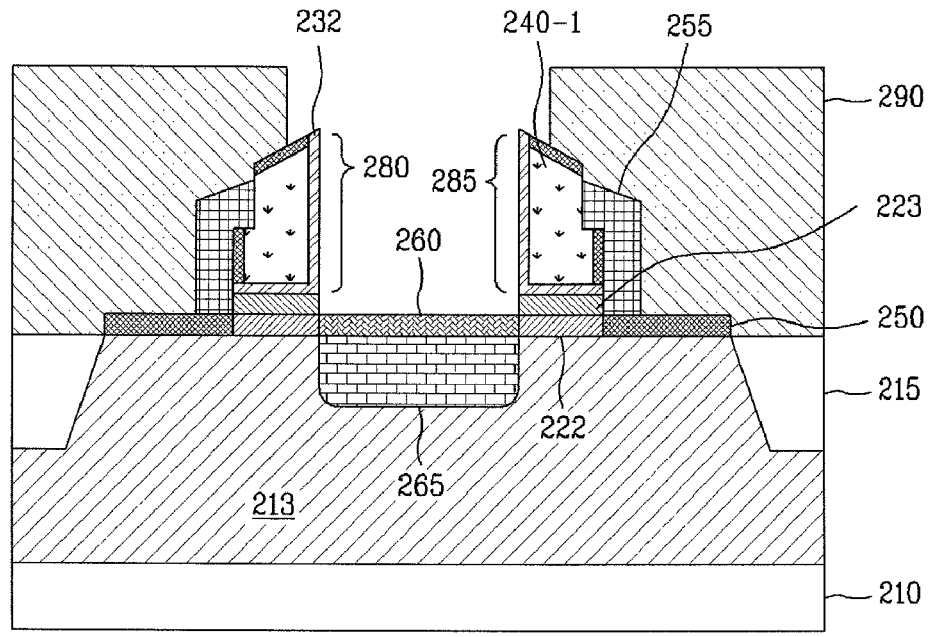

As shown in example FIG. 2K, a common source region 265 for the first split gate 280 and the second split gate 285 may be formed in the semiconductor substrate 210 under the third oxide film 260 by carrying out a photoresist patterning process using photolithography and an impurity ion implantation process.

For example, a first ion implantation mask 290 to expose only the third oxide film 260 may be formed over the semiconductor substrate 210 by photolithography, and the common source region 265 may be formed in the semiconductor substrate 210 under the third oxide film 260 by implanting impurity ions (for example, arsenic (As) or boron (B)) using the first ion implantation mask 290.

Figure 2L:
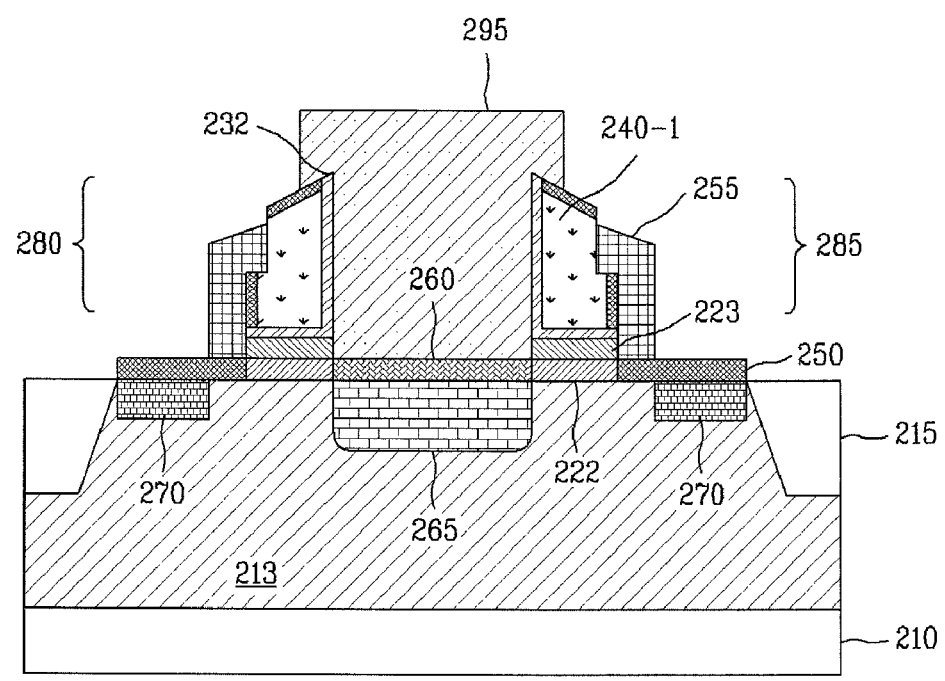

Thereafter, as shown in example FIG. 2L, drain regions 270 may be formed at respective portions of the active region 213 adjacent to the second gate poly 255 of the first split gate 280 and the second gate poly 255 of the second split gate 285 by carrying out a photoresist patterning process using photolithography and an impurity ion implantation process. For example, a second ion implantation mask 295 to expose the respective portions of the active region 213 adjacent to the second gate poly 255 of the first split gate 280 and the second gate poly 255 of the second split gate 285 and not to expose the third oxide film 260 may be formed over the semiconductor substrate 210 by photolithography. Then, the drain regions 270 may be respectively formed at the portions of the active region 213 adjacent to the second gate poly 255 of the first split gate 280 and the second gate poly 255 of the second split gate 285 by implanting impurity ions (for example, arsenic (As) or boron (B)) using the second ion implantation mask 295.

At this point, a device manufactured according to embodiments includes a substrate 210, an active region 213 formed on the substrate, and device isolation regions 215 formed in the active region. First and second drain regions 270 may be formed adjacent the device isolation regions 215. A common source region 265 may be formed between and spaced apart from the first and second drain regions 270. First and second tunnel oxide films 222 may be formed over the active region 213 and between the common source region 265 and drain regions 270. First and second charge trap nitride films 223 may be formed over the first and second tunnel oxide films 222, respectively. First and second oxide films 232 may be formed over the first and second charge trap nitride films 223, respectively. First and second polysilicon layers 240 may be formed over the first and second oxide films 232, respectively. Third and fourth oxide films 250 may be formed adjacent the first and second tunnel oxide films 222, and over the first and second drain regions 270, respectively. First and second gate poly regions 255 may be formed over the third and fourth oxide films 250, respectively, with the first and second gate poly regions 255 connected to a portion of the first and second polysilicon layers 240, respectively. Fifth oxide film 260 may be formed over the common source region 265.

Figure 2M:
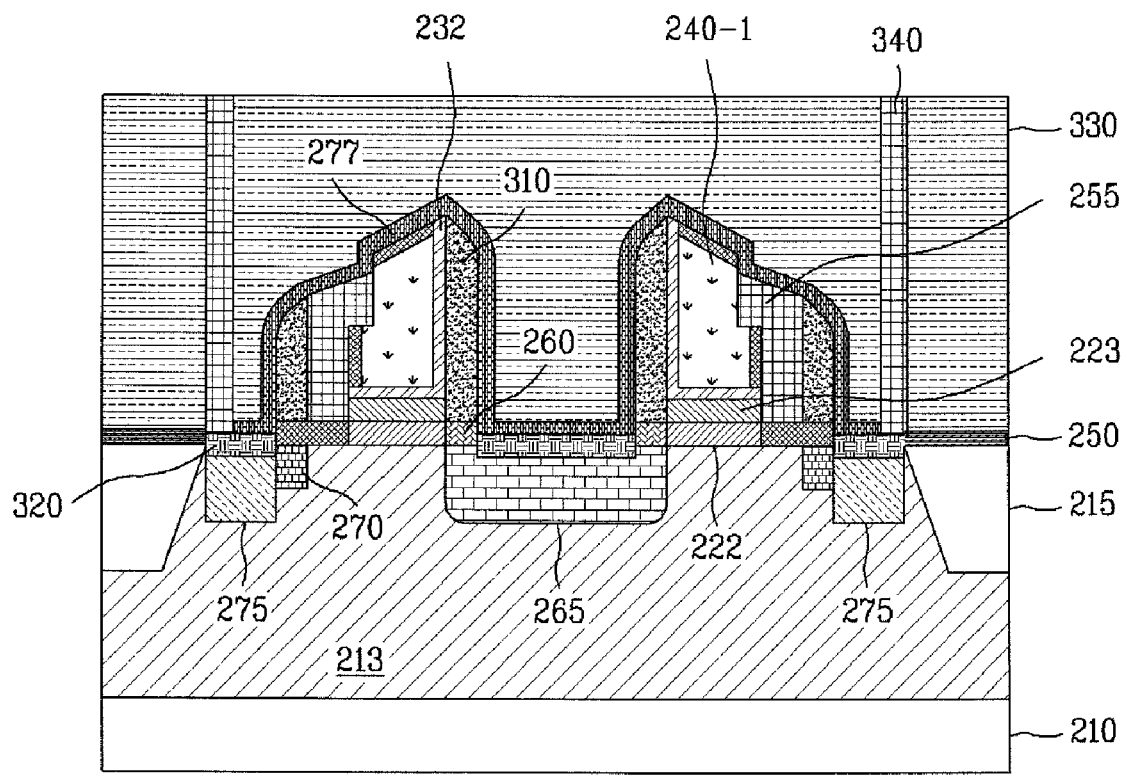

As shown in example FIG. 2M, a process after the formation of the common source region 265 and the formation of the drain regions 270 may be carried out according to a method used in a general logic process.

For example, a spacer 310 may be formed over the respective side walls of the second gate poly 255 of the first split gate 280 and the second gate poly 255 of the second split gate 285 and the side wall of the first oxide film 232 by depositing an insulating film over the entire surface of the semiconductor substrate 210 and then carrying out an etch-back process. After the formation of the spacer 310, lightly doped drain (LDD) regions 275 may be formed by carrying out a selective impurity ion implantation process.

Thereafter, a salicide film 320 may be formed over the semiconductor substrate 210 in the common source region 265 and the drain regions 270 by carrying out a salicide process. An insulating film 277 and an interlayer insulating film 330 may be deposited over the entire surface of the semiconductor substrate 210. Contact holes 340 may be formed by forming via holes corresponding to the drain regions 270 formed in the interlayer insulating film 330, and filling the insides of the via holes with a conductive material, such as tungsten.

As described above, in methods of forming a semiconductor memory device in accordance with embodiments, the split gates 280 and 285 are self-aligned and therefore symmetrically formed. Thus the charge trap nitride films 223 of the split gates 280 and 285 have a uniform length, preventing variations in characteristics between respective cells of memory devices.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method of manufacturing a semiconductor device, the method comprising:
   forming an oxide-nitride-oxide layer over a semiconductor substrate, and forming a recess over the semiconductor substrate by etching the oxide-nitride-oxide layer;
   forming a vertical structure pattern over the recess higher than the oxide-nitride-oxide layer;
   sequentially forming a spacer oxide film and a first gate poly over a side wall of the vertical structure pattern, and forming a nitride film spacer over a partial region of the side wall of the first gate poly;
   removing the nitride film spacer, and forming a second gate poly in a spacer shape over the side wall of the first gate poly; and
   forming a first split gate and a second split gate, symmetrically divided from each other, by removing the vertical structure pattern.

2. The method of claim 1, wherein forming the recess includes:
   forming the oxide-nitride-oxide layer by sequentially depositing a tunnel oxide film, a charge trap nitride film, and a buffer oxide film over the semiconductor substrate;
   forming a photoresist pattern over the buffer oxide film; and forming the recess to expose a partial region of the tunnel oxide film by etching the buffer oxide film and the charge trap nitride film using the photoresist pattern as an etching mask.

3. The method of claim 2, wherein forming the vertical structure pattern over the recess higher than the oxide-nitride-oxide layer includes:
depositing a nitride film over the semiconductor substrate provided with the recess using chemical vapor deposition; and
forming the vertical structure pattern over the exposed region of the tunnel oxide film by patterning the deposited nitride film by photolithography and etching.

4. The method of claim 3, wherein the formation of the nitride film spacer in the partial region of the side wall of the first gate poly includes:
sequentially forming an oxide film, a polysilicon layer, and a nitride film to cover the upper surface and side wall of the vertical structure pattern; and
forming the spacer oxide film and the first gate poly in a spacer over the side wall of the vertical structure pattern by carrying out an etch-back process upon the oxide film, the polysilicon layer, and the nitride film until the upper surface of the vertical structure pattern and the partial region of the tunnel oxide film are exposed, and forming the nitride film spacer by leaving the nitride film which was not etched back in the partial region of the side wall of the first gate poly.

5. The method of claim 4, further comprising carrying out an oxidation process on the semiconductor substrate, exposed by removing the partial region of the tunnel oxide film exposed by the etch-back process, using thermal oxidation, between forming the nitride film spacer and forming the second gate poly in the spacer shape.

6. The method of claim 4, including:
removing the tunnel oxide film exposed by removing the vertical structure pattern;
forming an oxide film over the semiconductor substrate, exposed by removing the tunnel oxide film, using thermal oxidation; and
forming a common source region for the first split gate and the second split gate in the semiconductor substrate under the oxide film by carrying out a photoresist patterning process using photolithography and an impurity ion implantation process.

7. The method of claim 6, including forming drain regions at respective portions of the semiconductor substrate adjacent to the second gate poly of the first split gate and the second gate poly of the second split gate by carrying out a photoresist patterning process using photolithography and an impurity ion implantation process.

8. The method of claim 3, wherein the tunnel oxide film is formed with a thickness between 50 Å~80 Å, the charge trap nitride film is formed with a thickness between 70Å~100Å, the buffer oxide film is formed with a thickness between 50Å~80 Å, and the nitride film is deposited with a thickness between 3,000 Å~4,000 Å.

9. The method of claim 1, wherein the formation of the second gate poly includes:
removing the spacer-shaped nitride film using wet-etching;
depositing polysilicon over the semiconductor substrate provided with the first gate poly, from which the nitride film is removed; and
forming the second gate poly in the spacer shape over the side wall of the first gate poly by carrying out an etch-back process upon the deposited polysilicon.

10. The method of claim 9, wherein the second gate poly contacts the first gate poly where the nitride film spacer is removed.

11. The method of claim 2, wherein forming the vertical structure pattern over the recess higher than the oxide-nitride-oxide layer includes:
depositing a silicon oxide film over the semiconductor substrate provided with the recess using chemical vapor deposition; and
forming the vertical structure pattern over the exposed region of the tunnel oxide film by patterning the deposited silicon oxide film by photolithography and etching.

12. The method of claim 11, wherein the formation of the nitride film spacer in the partial region of the side wall of the first gate poly includes:
sequentially forming an oxide film, a polysilicon layer, and a nitride film to cover the upper surface and side wall of the vertical structure pattern; and
forming the spacer oxide film and the first gate poly in a spacer over the side wall of the vertical structure pattern by carrying out an etch-back process upon the oxide film, the polysilicon layer, and the nitride film until the upper surface of the vertical structure pattern and the partial region of the tunnel oxide film are exposed, and forming the nitride film spacer by leaving the nitride film which was not etched back in the partial region of the side wall of the first gate poly.

13. The method of claim 12, further comprising carrying out an oxidation process on the semiconductor substrate, exposed by removing the partial region of the tunnel oxide film exposed by the etch-back process, using thermal oxidation, between forming the nitride film spacer and forming the second gate poly in the spacer shape.

14. The method of claim 12, including:
removing the tunnel oxide film exposed by removing the vertical structure pattern;
forming an oxide film over the semiconductor substrate, exposed by removing the tunnel oxide film, using thermal oxidation; and
forming a common source region for the first split gate and the second split gate in the semiconductor substrate under the oxide film by carrying out a photoresist patterning process using photolithography and an impurity ion implantation process.

15. The method of claim 14, including forming drain regions at respective portions of the semiconductor substrate adjacent to the second gate poly of the first split gate and the second gate poly of the second split gate by carrying out a photoresist patterning process using photolithography and an impurity ion implantation process.

16. The method of claim 11, wherein the tunnel oxide film is formed with a thickness between 50 Å~80 Å, the charge trap nitride film is formed with a thickness between 70 Å~100 Å, the buffer oxide film is formed with a thickness between 50 Å~80 Å, and the silicon oxide film is deposited with a thickness between 3,000 Å~4,000 Å.

* * * * *